(12) United States Patent
Watanabe

(10) Patent No.: US 10,219,378 B2
(45) Date of Patent: Feb. 26, 2019

(54) FLEXIBLE PRINTED CIRCUIT AND DISPLAY DEVICE

(71) Applicant: Sharp Kabushiki Kaisha, Sakai, Osaka (JP)

(72) Inventor: Hisashi Watanabe, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 15/556,700

(22) PCT Filed: Mar. 24, 2016

(86) PCT No.: PCT/JP2016/059281
§ 371 (c)(1),
(2) Date: Sep. 8, 2017

(87) PCT Pub. No.: WO2016/158629
PCT Pub. Date: Oct. 6, 2016

(65) Prior Publication Data
US 2018/0063957 A1    Mar. 1, 2018

(30) Foreign Application Priority Data

Mar. 31, 2015  (JP) ................. 2015-072633

(51) Int. Cl.
*H05K 1/14* (2006.01)
*G02F 1/1345* (2006.01)
(Continued)

(52) U.S. Cl.
CPC ......... *H05K 1/147* (2013.01); *G02F 1/13452* (2013.01); *H05K 1/028* (2013.01);
(Continued)

(58) Field of Classification Search
CPC ............ H05K 1/028; H05K 2201/052; H05K 2201/055; H05K 1/147; H05K 1/118;
(Continued)

(56) References Cited

U.S. PATENT DOCUMENTS 4,845,315 A * 7/1989 Stopper ............... H01B 7/0846
361/827
2007/0019076 A1   1/2007 Teramoto et al.
(Continued)

FOREIGN PATENT DOCUMENTS

CN      204215385 U    3/2015
JP       56-134018 U   10/1981
(Continued)

OTHER PUBLICATIONS

Official Communication issued in International Patent Application No. PCT/JP2016/059281, dated Jun. 7, 2016.

*Primary Examiner* — Steven T Sawyer
(74) *Attorney, Agent, or Firm* — Keating & Bennett, LLP

(57) ABSTRACT

The present invention provides a flexible printed circuit capable of being mounted to an outer edge portion of a display panel including a periphery that is at least partially curved. The flexible printed circuit of the present invention includes: a flexible substrate provided with multiple slits; multiple conductive lines; and multiple terminals electrically coupled with the respective conductive lines in an independent manner. The slits and the conductive lines are disposed in the longitudinal direction of the flexible substrate. The terminals are disposed on a first longitudinal end of the flexible substrate.

16 Claims, 12 Drawing Sheets

(51) Int. Cl.
*H05K 1/02* (2006.01)
*H05K 1/11* (2006.01)
*H05K 1/18* (2006.01)
*G02F 1/1335* (2006.01)

(52) U.S. Cl.
CPC .............. *H05K 1/118* (2013.01); *H05K 1/148* (2013.01); *H05K 1/189* (2013.01); *G02F 1/133615* (2013.01); *G02F 2201/56* (2013.01); *H05K 2201/055* (2013.01); *H05K 2201/056* (2013.01); *H05K 2201/09009* (2013.01); *H05K 2201/09027* (2013.01); *H05K 2201/10128* (2013.01); *H05K 2201/10136* (2013.01)

(58) Field of Classification Search
CPC ................... H05K 1/148; H05K 1/189; H05K 2201/09009; H05K 2201/09027; H05K 2201/10128; H05K 2201/10136; G02F 1/13452
See application file for complete search history.

(56) References Cited

U.S. PATENT DOCUMENTS

| | | | |
|---|---|---|---|
| 2007/0034402 A1* | 2/2007 | Cheng | G02F 1/13452 174/260 |
| 2009/0128749 A1 | 5/2009 | Oono et al. | |
| 2010/0206620 A1 | 8/2010 | Teramoto et al. | |
| 2015/0189755 A1* | 7/2015 | Choi | H05K 1/028 361/749 |
| 2015/0201492 A1* | 7/2015 | Kim | H05K 1/028 361/749 |
| 2015/0208522 A1* | 7/2015 | Kim | H05K 1/028 361/749 |

FOREIGN PATENT DOCUMENTS

| | | |
|---|---|---|
| JP | 06-289268 A | 10/1994 |
| JP | 2006-276359 A | 10/2006 |
| JP | 2006-276580 A | 10/2006 |
| JP | 2007-043129 A | 2/2007 |
| JP | 2009-069768 A | 4/2009 |
| JP | 2009-128420 A | 6/2009 |

* cited by examiner (a)

(b)

FLEXIBLE PRINTED CIRCUIT AND DISPLAY DEVICE

TECHNICAL FIELD

The present invention relates to flexible printed circuits and display devices. The present invention specifically relates to a flexible printed circuit to be suitably mounted to a display panel and a display device including the flexible printed circuit.

BACKGROUND ART

Display devices such as liquid crystal display devices are used in a wide variety of uses, and there arises a strong demand for display devices with a shape other than conventional quadrangular shapes. In addition, from the viewpoints of space saving and design characteristics, there is also a strong demand for display devices with a narrow frame. For example, a display device including a partially arc-shaped periphery can be achieved by attaching a frame with an arc-shaped periphery to a conventional quadrangular display device. However, the display region of this display device is actually a quadrangular shape, and thus the frame, which is the region from an edge of the display region to the periphery of the display device, becomes thick and impairs the design characteristics. In order to overcome these problems, Patent Literatures 1 to 4 propose liquid crystal display devices including a circular or elliptic display region.

CITATION LIST

Patent Literature
Patent Literature 1: JP 2006-276359 A
Patent Literature 2: JP 2006-276580 A
Patent Literature 3: JP 2009-69768 A
Patent Literature 4: JP 2009-128420 A

SUMMARY OF INVENTION

Technical Problem

Still, any conventional techniques have difficulty in achieving a display device not only the display region but also the whole periphery is curved (e.g., a circular or elliptic display device). The reason for this is described below.

A display device needs to be coupled with drive circuits such as a signal line drive circuit, and this coupling is achieved via a flexible printed circuit (FPC) provided with conductive lines, for example. In this case, the flexible printed circuit is commonly attached to an outer edge portion of the display panel and bent toward the back surface side of the display panel to be coupled with the drive circuits. However, if the periphery of the outer edge portion of the display panel attached to the flexible printed circuit is at least partially curved, the flexible printed circuit cannot be bent along this periphery of the outer edge portion. This means the outer edge portion of the display panel to be attached to the flexible printed circuit needs to have a periphery that is constituted by a single linear portion. If the width of the flexible printed circuit is as small as possible, the outer edge portion of the display panel to be attached to the flexible printed circuit can also be smaller. Thus, in theory, the periphery of the display device would have a shape closer to a curved shape. However, the conductive lines of such a flexible printed circuit need to be disposed at a narrower pitch, which is difficult to achieve. Therefore, any conventional techniques fail to achieve a flexible printed circuit capable of being mounted to an outer edge portion of a display panel including a periphery that is at least partially curved and, as a result, fail to achieve a display device including an entirely curved periphery.

As described above, no means was found out for achieving a flexible printed circuit capable of being mounted to an outer edge portion of a display panel including a periphery that is at least partially curved. For example, with regard to the inventions disclosed in Patent Literatures 1 to 4, a display panel attached to a flexible printed circuit includes an outer edge portion the periphery of which is linear. Thus, they do not achieve a flexible printed circuit capable of being mounted to an outer edge portion including a periphery that is at least partially curved.

The present invention is devised in view of the above state of the art, and aims to provide a flexible printed circuit capable of being mounted to an outer edge portion of a display panel including a periphery that is at least partially curved, and a display device including the flexible printed circuit.

Solution to Problem

The present inventor performed various studies on a flexible printed circuit capable of being attached to an outer edge portion of a display panel including a periphery that is at least partially curved, and focused on providing multiple slits for a flexible substrate constituting the flexible printed circuit. Then, the inventor found out providing multiple slits and multiple conductive lines of the flexible printed circuit in the longitudinal direction of the flexible substrate and further providing multiple terminals electrically coupled with the respective conductive lines in an independent manner at a first longitudinal end of the flexible substrate. Thereby, the inventor arrived at the solution of the above problems and completed the present invention.

One aspect of the present invention may be a flexible printed circuit including: a flexible substrate provided with multiple slits; multiple conductive lines; and multiple terminals electrically coupled with the respective conductive lines in an independent manner, the slits and the conductive lines being disposed in the longitudinal direction of the flexible substrate, the terminals being disposed on a first longitudinal end of the flexible substrate.

Another aspect of the present invention may be a display device including: at least one flexible printed circuit which is the flexible printed circuit described above; and a display panel including a curved outer edge portion having a curved whole shape at at least part of the outer edge thereof, the curved outer edge portion being provided with multiple panel terminals, the second longitudinal end of the flexible substrate and the curved outer edge portion being attached to each other.

Advantageous Effects of Invention

The present invention can provide a flexible printed circuit capable of being mounted to an outer edge portion of a display panel including a periphery that is at least partially curved and a display device including the flexible printed circuit. The flexible printed circuit of the present invention can suitably achieve a display device including an entirely curved periphery.

BRIEF DESCRIPTION OF THE DRAWINGS

FIG. 4(a) is a view seen from the viewing side and FIG. 4(b) is a view seen from the back surface side.

DESCRIPTION OF EMBODIMENTS

Figure 1:
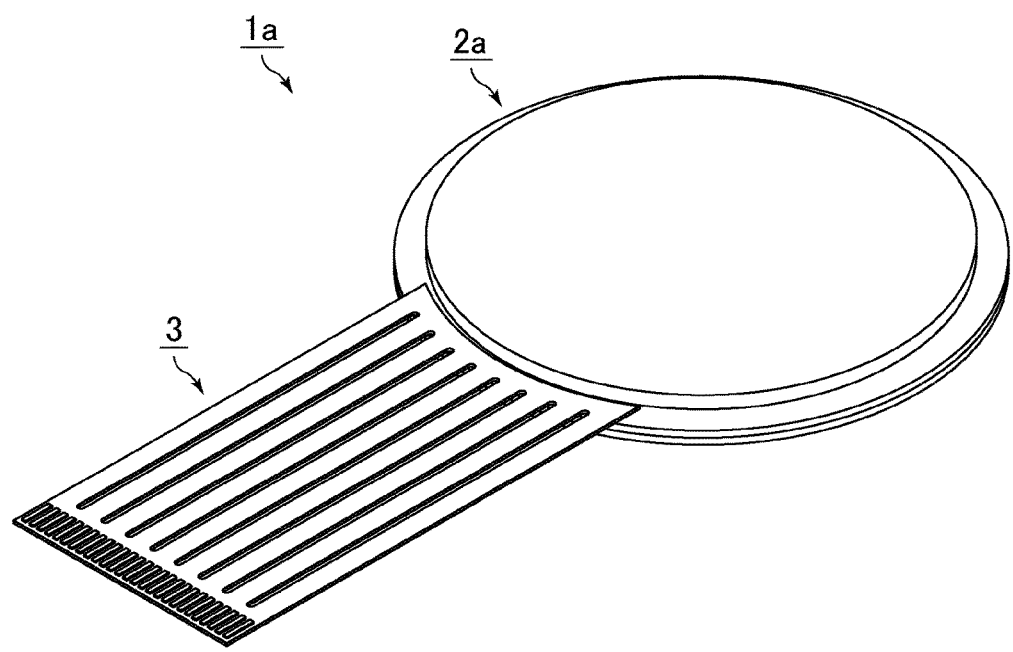
FIG. 1 is a schematic view of a liquid crystal display device of Embodiment 1.

Hereinafter, the present invention is described in more detail based on embodiments with reference to the drawings. The embodiments, however, are not intended to limit the scope of the present invention. In the following drawings, the same components or those having the same function have the same reference numerals except for their additional alphabetic characters, and repetition of the description thereof is omitted as appropriate. The configurations of the embodiments may appropriately be combined or modified within the spirit of the present invention.

The following embodiments describe the cases where the display panel is a liquid crystal display panel (i.e., the display device is a liquid crystal display device). Still, the type of the display panel is not limited thereto.

Embodiment 1

Figure 2:
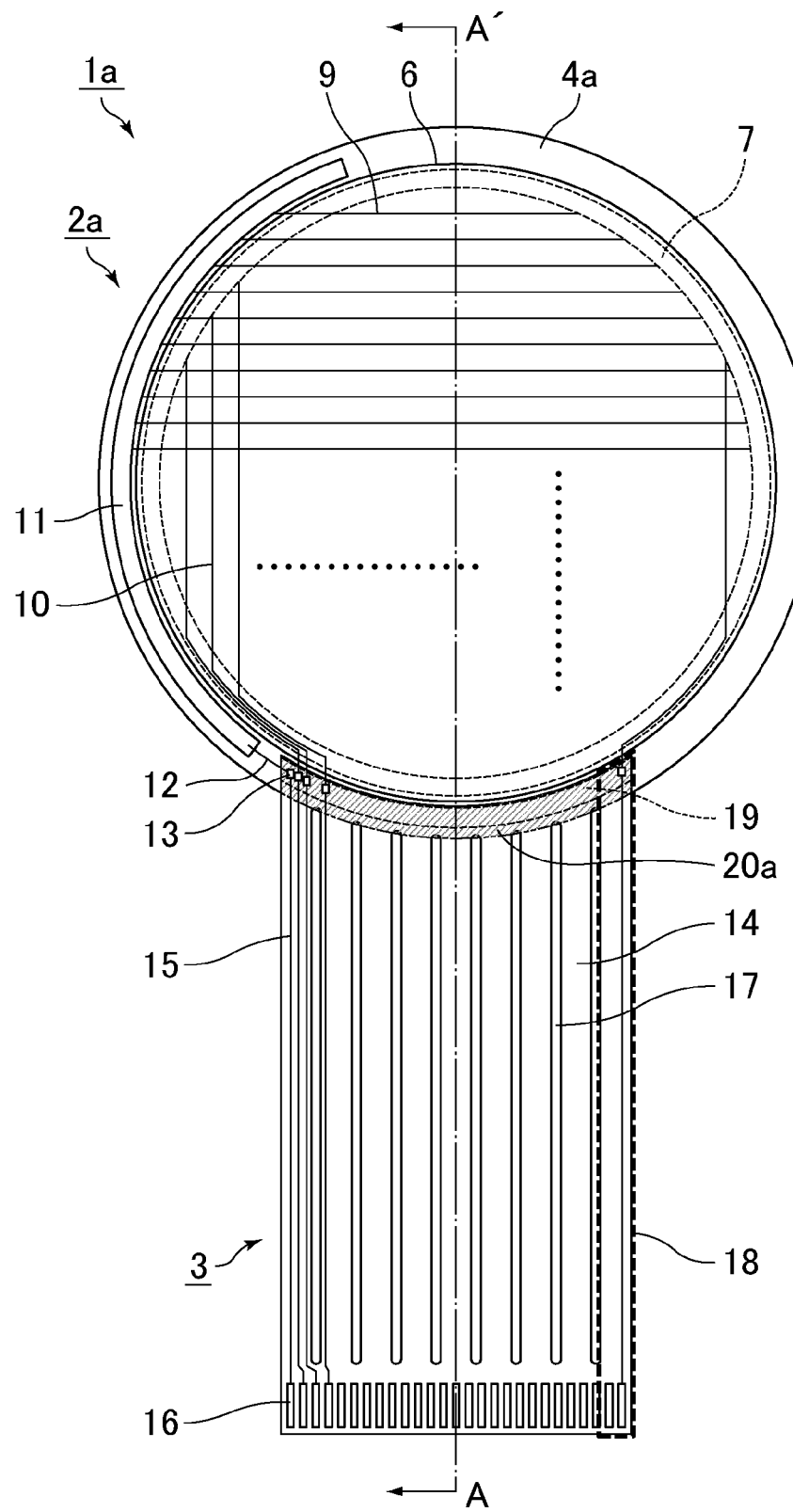
FIG. 2 is a schematic plan view of the liquid crystal display device of Embodiment 1.
Figure 3:
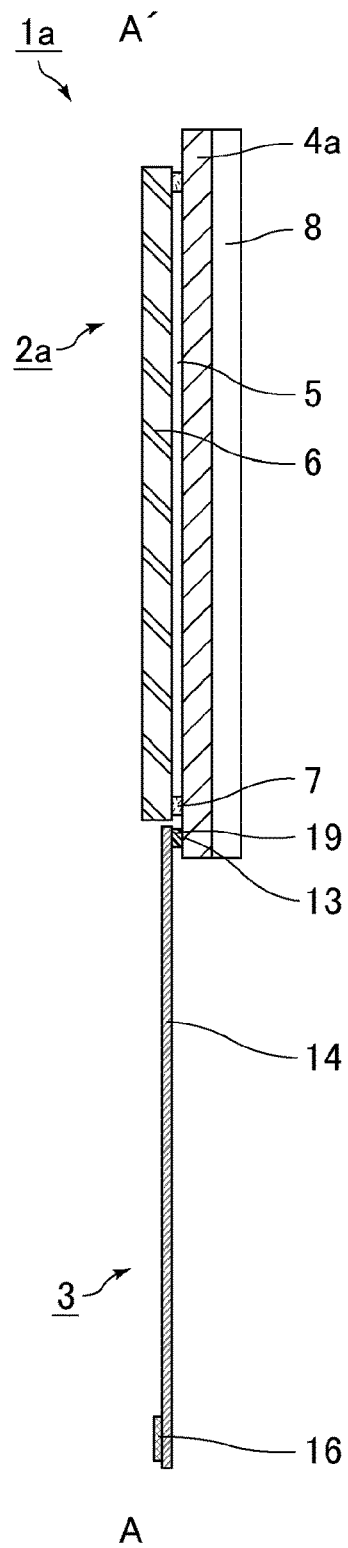
FIG. 3 is a schematic cross-sectional view of a cross section taken along the line A-A' in FIG. 2.

FIG. 1 is a schematic view of a liquid crystal display device of Embodiment 1. FIG. 2 is a schematic plan view of the liquid crystal display device of Embodiment 1. FIG. 3 is a schematic cross-sectional view of a cross section taken along the line A-A' in FIG. 2. Hereinafter, a flexible printed circuit and a liquid crystal display device of Embodiment 1 are described with reference to FIG. 1, FIG. 2, and FIG. 3.

A liquid crystal display device 1a includes a liquid crystal display panel 2a and a flexible printed circuit 3.

As illustrated in FIG. 3, the liquid crystal display panel 2a includes a thin film transistor array substrate 4a, a liquid crystal layer 5, and a color filter substrate 6 in the given order from the back surface side to the viewing side. The thin film transistor array substrate 4a and the color filter substrate 6 are attached to each other at the peripheral portions thereof with a sealing material 7 in between so as to sandwich the liquid crystal layer 5. The "viewing side" as used herein means the left side of the liquid crystal display device 1a in FIG. 3. The "back surface side" as used herein means the right side of the liquid crystal display device 1a in FIG. 3.

The thin film transistor array substrate 4a may have a structure in which components such as thin film transistor elements configured to drive the respective pixels, pixel electrodes (transparent electrodes), and various conductive lines (scanning lines 9 and signal lines 10) are disposed on a glass substrate. Instead of the glass substrate, the structure may include a transparent substrate such as a plastic substrate. The semiconductor layer of each thin film transistor element may have any composition, and may contain amorphous silicon, low temperature polysilicon, or an oxide semiconductor, for example. The oxide semiconductor may be formed from a compound containing indium, gallium, zinc, and oxygen or a compound containing indium, zinc, and oxygen, for example. The oxide semiconductor formed from a compound containing indium, gallium, zinc, and oxygen less causes off-leakage currents and, when voltage is applied thereto, enables pause driving where the state of voltage application is maintained until the next data is written. Accordingly, from the viewpoint of low power consumption, the oxide semiconductor is preferably a compound containing indium, gallium, zinc, and oxygen.

As illustrated in FIG. 2, the thin film transistor array substrate 4a may be provided at a peripheral portion thereof with a scanning line drive circuit (gate driver) 11 configured to supply voltage to the scanning lines 9. The scanning line drive circuit 11 may be directly disposed on the thin film transistor array substrate 4a, or may be mounted as a chip-like integrated circuit (IC) to the thin film transistor array substrate 4a. A signal line drive circuit (source driver) configured to supply voltage to the signal lines 10 may be directly disposed on the thin film transistor array substrate 4a, or may be mounted as a chip-like integrated circuit to the thin film transistor array substrate 4a, the flexible printed circuit 3, or a drive circuit coupled with the flexible printed circuit 3. In FIG. 2, some of the scanning lines 9 and some of the signal lines 10 are illustrated. The same applies to the other figures.

The color filter substrate 6 may have a structure in which components such as color filter layers for the respective pixels are disposed on a glass substrate, for example. Instead of the glass substrate, the structure may include a transparent substrate such as a plastic substrate. The color filter layers may form any combination of colors, such as a combination of red, green, and blue or a combination of red, green, blue, and yellow. The color filter substrate 6 may further include a pixel electrode (a transparent electrode) configured to drive the pixels.

The liquid crystal display device 1a may further include a backlight 8 as illustrated in FIG. 3 on the back surface side of the liquid crystal display panel 2a (the back surface side of the thin film transistor array substrate 4a). The backlight 8 may be of any type, such as an edge-lit type or a direct-lit type. The backlight 8 may have any display light source, such as a light emitting diode (LED) or a cold cathode fluorescent lamp (CCFL).

The signal lines 10 and a conductive line 12 led from the scanning line drive circuit 11 are electrically coupled with respective panel terminals 13 disposed on a curved outer edge portion 20a of the liquid crystal display panel 2a (an outer edge portion of the thin film transistor array substrate 4a) in an independent manner. In FIG. 2, some of the panel terminals 13 are illustrated. The same applies to the other figures. The curved outer edge portion 20a provided with the panel terminals 13 has a curved whole shape, and is a portion attached to the flexible printed circuit 3. The liquid crystal display panel 2a includes such a curved outer edge portion 20a at at least part of the outer edge thereof. The phrase "the curved outer edge portion has a curved whole shape" herein at least means, in a macroscopic view, at least part of the periphery of the curved outer edge portion is substantially curved, including the cases where the periphery of the curved outer edge portion has an arc shape or the periphery of the curved outer edge portion is constituted by a polygonal line and is substantially curved, for example. As illustrated in FIG. 2, the present embodiment describes the case where the liquid crystal display panel 2a has a circular shape and the periphery of the curved outer edge portion 20a provided with the panel terminals 13 has an arc shape.

As illustrated in FIG. 2, the flexible printed circuit 3 includes a flexible substrate 14, multiple conductive lines 15, and multiple terminals 16. The flexible substrate 14 is provided with multiple slits 17. The conductive lines 15 and the slits 17 are disposed in the longitudinal direction of the flexible substrate 14 (upward and downward directions in FIG. 2). The conductive lines 15 are disposed on the flexible substrate 14 so as to keep away from the slits 17. The terminals 16 are electrically coupled with the respective conductive lines 15 in an independent manner. Multiple regions separated by the slits 17 in the flexible printed circuit 3 are referred to as divided portions 18. In FIG. 2, some of the conductive lines 15 are illustrated. Also, in FIG. 2, some of the divided portions 18 are illustrated. The same applies to the other figures.

The flexible substrate 14 may be an insulating film, for example. Examples of an insulating material include resin materials such as polyimide and polyester and metal thin plates provided with an insulating coat.

The conductive lines 15 may be formed from a conductor such as copper foil, for example. The conductive lines 15 may be disposed on either one or both surfaces of the flexible substrate 14, or may be passed inside the flexible substrate 14.

The slits 17 are cuts in the flexible substrate 14 (portions where the flexible substrate 14 is penetrated from one surface to the other surface and is removed). Each of the slits 17 may have any width, and preferably has a width of not smaller than 0.1 mm and not greater than 1 mm. The slits 17 with a width of not smaller than 0.1 mm enable suitable bending of the flexible printed circuit 3 as will be described later. The slits 17 with a width of not greater than 1 mm enable a guarantee of sufficient distances between the conductive lines 15, making it easier to arrange the conductive lines 15.

The terminals 16 are disposed on a first longitudinal end of the flexible substrate 14. A second longitudinal end of the flexible substrate 14 (the end on the side attached to the liquid crystal display panel 2a) has a curved shape. The second longitudinal end of the flexible substrate 14 is provided with ends of the conductive lines 15 or conductive portions electrically coupled with the conductive lines 15.

As illustrated in FIG. 2 and FIG. 3, the curved outer edge portion 20a of the liquid crystal display panel 2a provided with the panel terminals 13 and the curved second longitudinal end of the flexible substrate 14 are attached to each other with an anisotropic conductive film (ACF) 19 in between. This suitably enables electric coupling between the panel terminals 13 of the liquid crystal display panel 2a and the respective conductive lines 15 (or the aforementioned conductive portions) of the flexible printed circuit 3 via the anisotropic conductive film 19. The panel terminals 13 of the liquid crystal display panel 2a and the conductive lines 15 (or the aforementioned conductive portions) of the flexible printed circuit 3 may be directly coupled with each other without any member such as the anisotropic conductive film 19 in between. The terminals 16 of the flexible printed circuit 3 on the first longitudinal end of the flexible substrate 14 are electrically coupled with an outside drive circuit. Thereby, image signals outputted from the drive circuit are transmitted via the conductive lines 15 to the liquid crystal display panel 2a and, as a result, an image is displayed.

The second longitudinal end of the flexible substrate 14 attached to the liquid crystal display panel 2a may have any shape, and this shape may be appropriately selected in accordance with the shape of the periphery of the curved outer edge portion 20a of the liquid crystal display panel 2a. For example, for the periphery of the curved outer edge portion 20a of the liquid crystal display panel 2a having a convexly curved shape as illustrated in FIG. 2, the second longitudinal end of the flexible substrate 14 preferably has a concavely curved shape as illustrated in FIG. 2. For the periphery of the curved outer edge portion 20a of the liquid crystal display panel 2a having a concavely curved shape, the second longitudinal end of the flexible substrate 14 preferably has a convexly curved shape. In order to suitably attach the second longitudinal end of the flexible substrate 14 to the periphery of the curved outer edge portion 20a of the liquid crystal display panel 2a in a shape-dependent manner, the second longitudinal end preferably has a shape that is at least partially curved.

Figure 4:
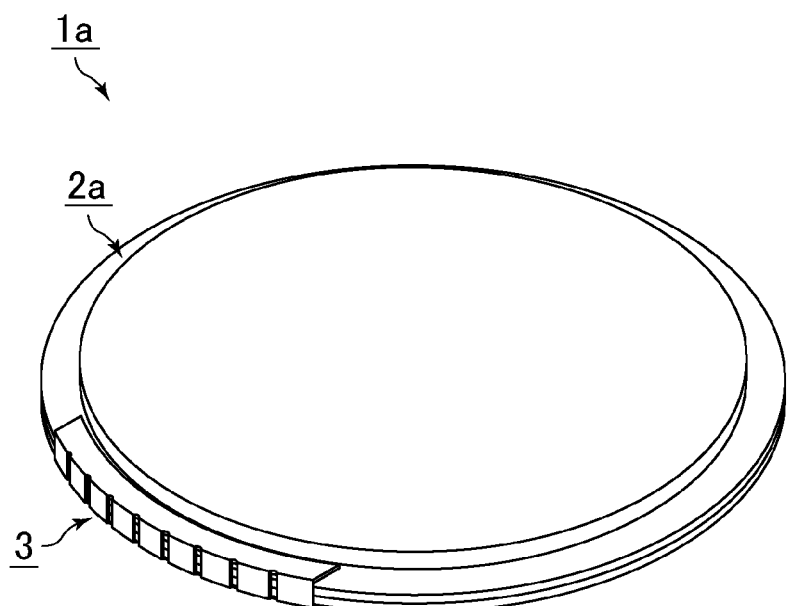
FIG. 4 are schematic views of the liquid crystal display device of Embodiment 1 with a flexible printed circuit being bent toward the back surface side of the liquid crystal display panel.
Figure 4:
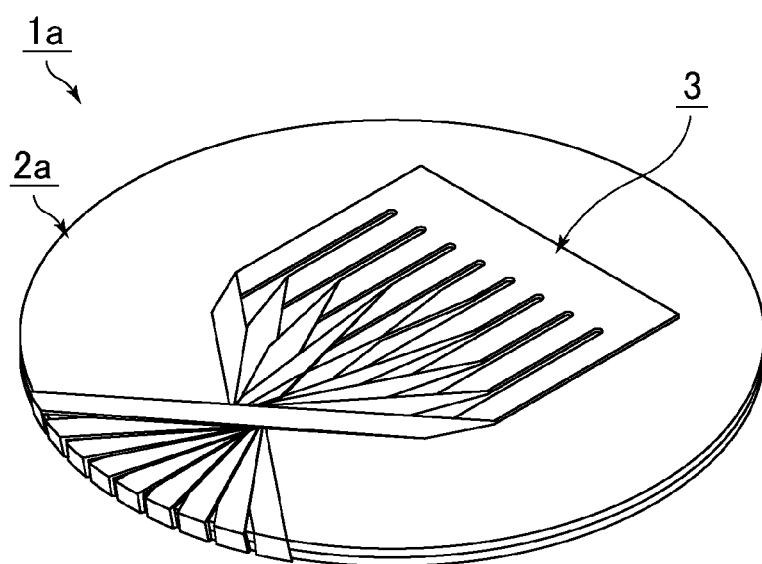
Figure 5:
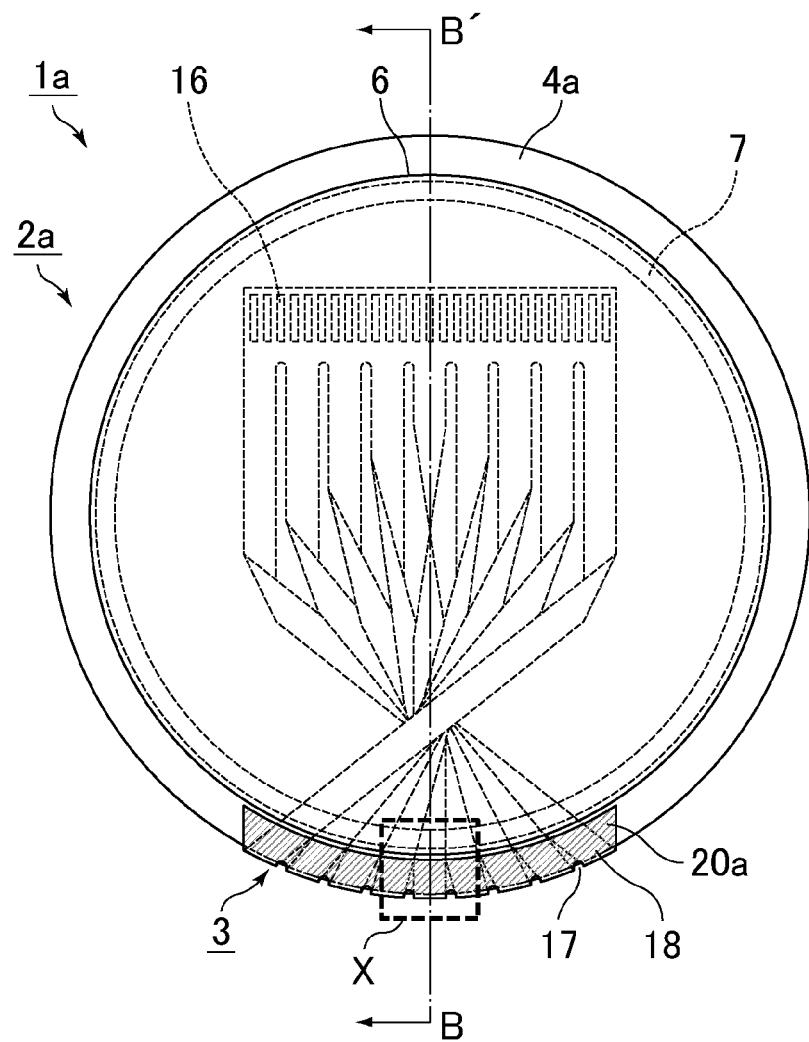
FIG. 5 is a schematic plan view of the liquid crystal display device of Embodiment 1 with the flexible printed circuit being bent toward the back surface side of the liquid crystal display panel.
Figure 6:
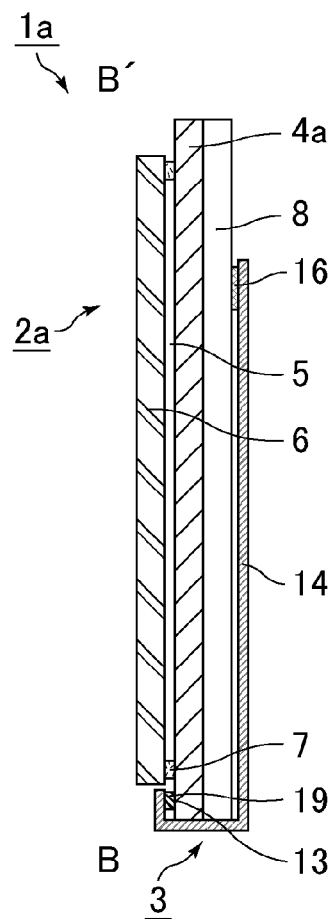
FIG. 6 is a schematic cross-sectional view of a cross section taken along the line B-B' in FIG. 5.

Next, a method of bending the flexible printed circuit 3 toward the back surface side of the liquid crystal display panel 2a is described with reference to FIG. 4, FIG. 5, and FIG. 6. FIG. 4 are schematic views of the liquid crystal display device of Embodiment 1 with a flexible printed circuit being bent toward the back surface side of the liquid crystal display panel; FIG. 4(a) is a view seen from the viewing side and FIG. 4(b) is a view seen from the back surface side. FIG. 5 is a schematic plan view of the liquid crystal display device of Embodiment 1 with the flexible printed circuit being bent toward the back surface side of the liquid crystal display panel. FIG. 6 is a schematic cross-sectional view of a cross section taken along the line B-B' in FIG. 5.

Each of the divided portions 18 of the flexible printed circuit 3 is bent toward the back surface side of the liquid crystal display panel 2a along the periphery of the curved outer edge portion 20a of the liquid crystal display panel 2a attached to the flexible substrate 14. Specifically, as illustrated in FIG. 6, each divided portion 18 is bent twice, i.e., along the corner of the thin film transistor array substrate 4a and along the corner of the backlight 8, toward the back surface side of the liquid crystal display panel 2a. At this time, the corner of the thin film transistor array substrate 4a and the corner of the backlight 8, which correspond to the positions where the divided portions 18 are bent, are preferably chamfered or rounded. If these corners are pointed (not chamfered or rounded), the flexible substrate 14 may unfortunately be split at these corners when the divided portions 18 are bent. Then, the flexible printed circuit 3 (each divided portion 18) is twisted by 180° on the back surface side of the liquid crystal display panel 2a. As a result, the divided portions 18 are crossed such that the positions of the respective divided portions are reversed left and right, and the terminals 16 of the flexible printed circuit 3 are located on the liquid crystal display panel 2a side of the flexible substrate 14. Therefore, this method enables suitable folding of the flexible printed circuit 3 on the back surface side of the liquid crystal display panel 2a while suppressing an increase in the thickness of the liquid crystal display device 1a. This method also enables transmission of image signals outputted from an outside drive circuit to the liquid crystal display panel 2a via the flexible printed circuit 3 to display an image while maintaining the outer shape (the circular shape in the present embodiment) of the liquid crystal display panel 2a.

As described above, Embodiment 1 enables mounting of the flexible printed circuit 3 while maintaining the outer shape of the liquid crystal display panel 2a even when the periphery of the curved outer edge portion 20a of the liquid crystal display panel 2a attached to the flexible printed circuit 3 has an arc shape (curved shape). This suitably achieves a liquid crystal display device having a periphery that has an entirely curved shape, such as a circular shape or an elliptic shape. Needless to say, similar to conventional cases, the flexible printed circuit 3 can be mounted to an outer edge portion having a periphery that is constituted by a single linear portion. The above way of bending the flexible printed circuit 3 is merely an example. No matter what shape the curved outer edge portion 20a of the liquid crystal display panel 2a has, the flexible printed circuit 3 can be bent toward the back surface side of the liquid crystal display panel 2a as long as each divided portion 18 has a certain length.

Figure 7:
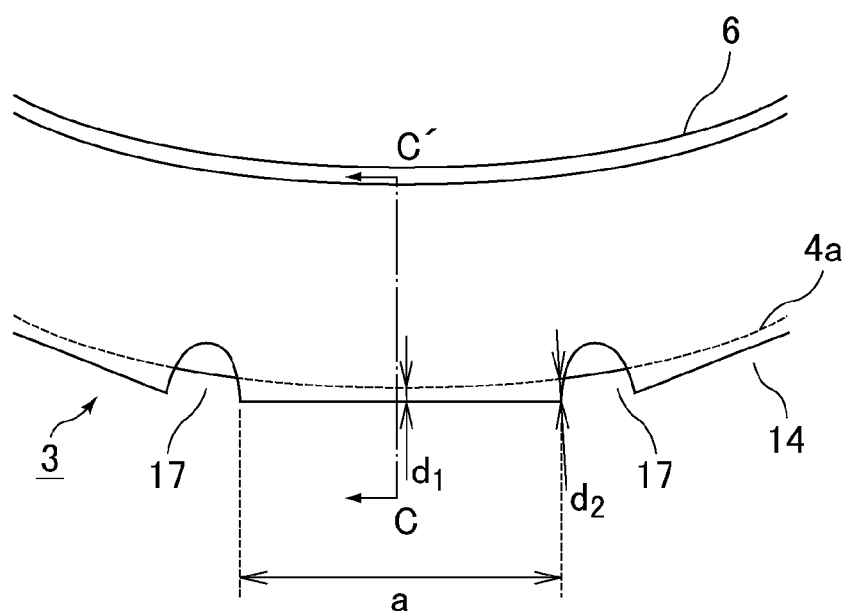
FIG. 7 is an enlarged schematic view of a portion X in FIG. 5.
Figure 8:
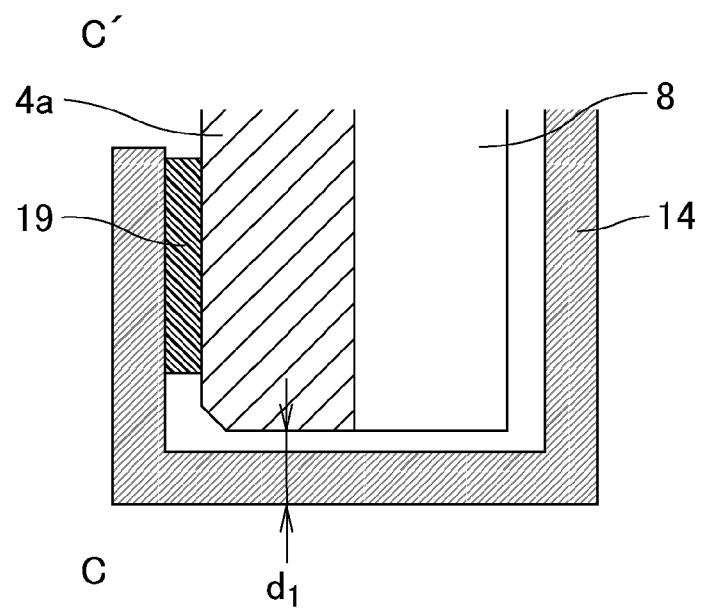
FIG. 8 is a schematic cross-sectional view of a cross section taken along the line C-C' in FIG. 7.

Next, a suitable arrangement of the slits 17 is described. FIG. 7 is an enlarged schematic view of a portion X in FIG. 5. FIG. 8 is a schematic cross-sectional view of a cross section taken along the line C-C' in FIG. 7. As illustrated in FIG. 7, when the flexible printed circuit 3 is attached to the liquid crystal display panel 2a, an end of each slit 17 is preferably designed to be on the inner side of the liquid crystal panel 2a relative to the periphery of the curved outer edge portion 20a (the periphery of the thin film transistor array substrate 4a in the present embodiment (the broken line in FIG. 7)) of the liquid crystal display panel 2a on the viewing side of the liquid crystal display panel 2a. This enables suitable bending of each divided portion 18 toward the back surface side of the liquid crystal display panel 2a along the periphery of the curved outer edge portion 20a of the liquid crystal display panel 2a.

Next, a preferred width between slits 17 is described. As illustrated in FIG. 7, letting $d_1$ be the amount of protrusion (unit: mm) in the middle portion between slits relative to the display panel 2a and letting $d_2$ be the amount of protrusion (unit: mm) at a corner (position corresponding to the slit 17) of the flexible printed circuit 3 relative to the liquid crystal display panel 2a in a plan view of the liquid crystal display device 1a, $d_2-d_1$ is preferably smaller than 1 mm, more preferably smaller than 0.5 mm, still more preferably smaller than 0.2 mm, although it depends on the screen size of the liquid crystal display panel 2a. If $d_2-d_1$ is not smaller than 1 mm, the degree of protrusion of the flexible printed circuit 3 at a corner may seem excessive and the shape of the periphery of the liquid crystal display device 1a may unfortunately be less likely to be considered as a curved shape. As illustrated in FIG. 8, $d_1$ corresponds to the sum of the thickness (unit: mm) of the flexible printed circuit 3 and the tolerance of the flexible printed circuit 3 in a bent state (the distance between the side of the liquid crystal display panel 2a and the flexible printed circuit 3, unit: mm). Here, letting a be the width (unit: mm) between slits 17 and letting R be the radius of curvature (not illustrated, unit: mm) of the liquid crystal display panel 2a (the radius of curvature of the thin film transistor array substrate 4a in the present embodiment), $d_2-d_1=[(R+d_1)^2+(a/2)^2]^{1/2}-R-d_1$ is satisfied. A preferred range of the width a between slits 17 is described below in accordance with the above preferred range of $d_2-d_1$.

(1) Cases where $d_2-d_1$ is Smaller than 1 mm (Preferred Range)

In these cases, $d_2-d_1=[(R+d_1)^2+(a/2)^2]^{1/2}-R-d_1<1$, in other words, $a^2<8R+8d_1+4$ is satisfied. Assuming that the thickness of the flexible printed circuit 3 is 0.05 mm and the tolerance of the flexible printed circuit 3 in a bent state is 0.15 mm, in other words, $d_1$ is 0.2 mm, the width a between slits 17 and the radius of curvature R of the liquid crystal display panel 2a show the relationship as shown in Table 1.

TABLE 1

| R (mm) | a (mm) |
|---|---|
| 10 | <9.25 |
| 20 | <12.86 |
| 30 | <15.67 |
| 40 | <18.04 |
| 50 | <20.13 |
| 60 | <22.03 |
| 70 | <23.78 |
| 80 | <25.4 |
| 90 | <26.93 |
| 100 | <28.38 |
| 200 | <40.06 |
| 300 | <49.04 |
| 400 | <56.61 |
| 500 | <63.28 |
| 600 | <69.32 |
| 700 | <74.87 |
| 800 | <80.03 |
| 900 | <84.88 |
| 1000 | <89.47 |

(2) Cases where $d_2-d_1$ is Smaller than 0.5 mm (More Preferred Range)

In these cases, $d_2-d_1=[(R+d_1) 2+(a/2)^2]^{1/2}-R-d_1<0.5$, in other words, $a^2<4R+4d_1+1$ is satisfied. Similar to the above cases (1), assuming that $d_1$ is 0.2 mm, the width a between slits 17 and the radius of curvature R of the liquid crystal display panel 2a show the relationship as shown in Table 2.

TABLE 2

| R (mm) | a (mm) |
|---|---|
| 10 | <6.46 |
| 20 | <9.04 |
| 30 | <11.03 |
| 40 | <12.72 |
| 50 | <14.20 |
| 60 | <15.54 |
| 70 | <16.78 |
| 80 | <17.93 |
| 90 | <19.02 |
| 100 | <20.04 |
| 200 | <28.31 |
| 300 | <34.66 |
| 400 | <40.02 |
| 500 | <44.74 |
| 600 | <49.00 |
| 700 | <52.93 |
| 800 | <56.58 |
| 900 | <60.01 |
| 1000 | <63.25 |

(3) Cases where $d_2-d_1$ is Smaller than 0.2 mm (Still More Preferred Range)

In these cases, $d_2-d_1=[(R+d_1)^2+(a/2)^2]^{1/2}-R-d_1<0.2$, in other words, $a^2<1.6R+1.6d_1+0.16$ is satisfied. Similar to the above cases (1), assuming that $d_1$ is 0.2 mm, the width a between slits 17 and the radius of curvature R of the liquid crystal display panel 2a show the relationship as shown in Table 3.

TABLE 3

| R (mm) | a (mm) |
|---|---|
| 10 | <4.05 |
| 20 | <5.69 |
| 30 | <6.96 |
| 40 | <8.02 |
| 50 | <8.97 |
| 60 | <9.82 |
| 70 | <10.60 |
| 80 | <11.33 |
| 90 | <12.01 |
| 100 | <12.66 |
| 200 | <17.90 |
| 300 | <21.91 |
| 400 | <25.30 |
| 500 | <28.29 |
| 600 | <30.99 |
| 700 | <33.47 |
| 800 | <35.78 |
| 900 | <37.95 |
| 1000 | <40.00 |

In order to satisfy that $d_2-d_1$ is smaller than 0.5 mm as shown in Table 2, for example, relative to the liquid crystal display panel 2a having a radius of curvature R of 50 mm, the width a between slits 17 needs to be smaller than 14.20 mm. In this case, for example, the flexible printed circuit 3 having a width of 50 mm needs to have a structure including four divided portions 18 and satisfy $a''$ 12.50 mm.

[Variation 1 of Embodiment 1]

Figure 9:
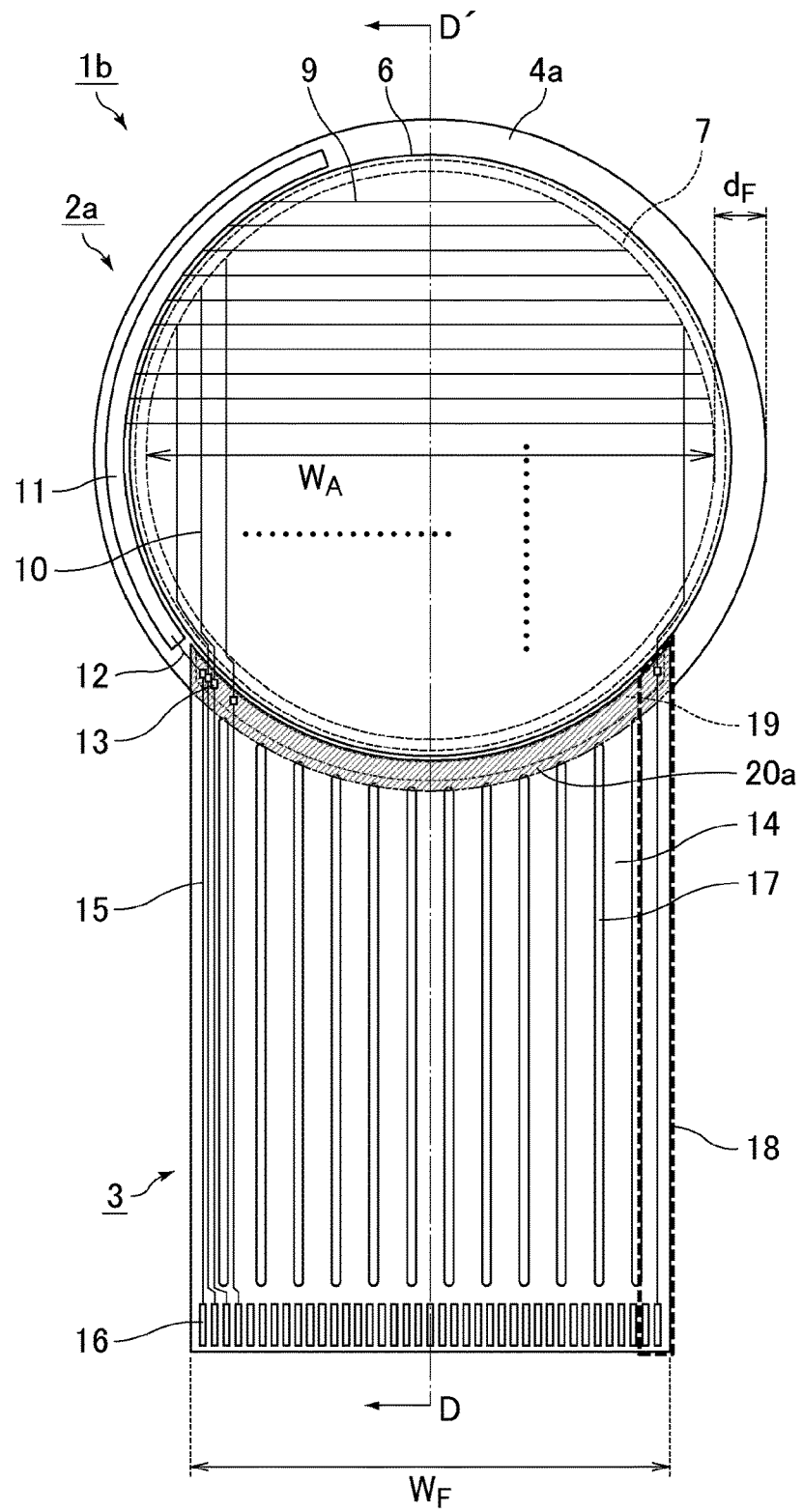
FIG. 9 is a schematic plan view of a liquid crystal display device of Variation 1 of Embodiment 1.
Figure 10:
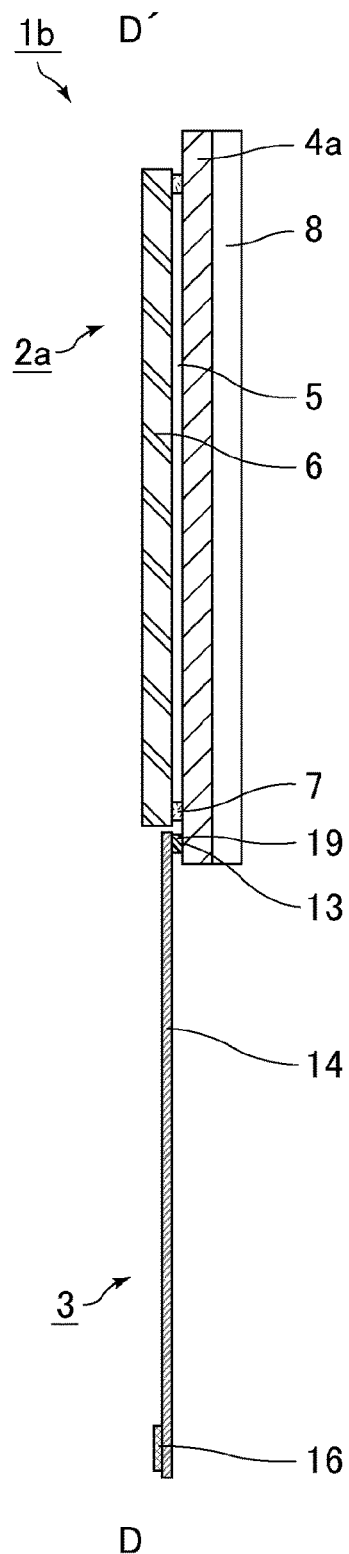
FIG. 10 is a schematic cross-sectional view of a cross section taken along the line D-D' in FIG. 9.

FIG. 9 is a schematic plan view of a liquid crystal display device of Variation 1 of Embodiment 1. FIG. 10 is a schematic cross-sectional view of a cross section taken along the line D-D' in FIG. 9. Variation 1 of Embodiment 1 is similar to Embodiment 1 except for the width of the flexible printed circuit, and thus the description of the same points is omitted as appropriate.

As is clear from the comparison between FIG. 2 and FIG. 9, the width of the flexible printed circuit 3 in a liquid crystal display device 1b is greater than that in Embodiment 1. This enables shorter distances of the conductive lines such as the signal lines 10 routed to be coupled with the conductive lines 15 of the flexible printed circuit 3, resulting in a narrower frame, than in Embodiment 1. The "frame" as used herein means a region from an edge (periphery) of the display region of the display panel to an edge (periphery) of the display panel. The size thereof corresponds to $d_F$ in FIG. 9. The "display region" means a region capable of displaying an image. For example, the display region in the liquid crystal display panel 2a corresponds to a region where the pixel electrodes (not illustrated) are disposed. In general, the display region is substantially identical to a region surrounded by the sealing material 7.

The flexible printed circuit 3 preferably has a width that is greater than 1/3 of the width of the display region of the liquid crystal display panel 2a and is not greater than the width of the display region of the liquid crystal display panel 2a. Although it depends on the screen size of the liquid crystal display panel 2a, the width of the flexible printed circuit 3 of not greater than 1/3 of the width of the display region may cause complicated routing of the conductive lines such as the signal lines 10, possibly resulting in a large frame. In contrast, the width of the flexible printed circuit 3 may be extended at most up to the width of the display region. The flexible printed circuit 3 having a width that is equal to the width of the display region hardly requires routing of the conductive lines such as the signal lines 10, enabling the narrowest frame. The "width of the flexible printed circuit" as used herein means the length in the direction perpendicular to the longitudinal direction of the flexible printed circuit, and corresponds to $W_F$ in FIG. 9. The "width of the display region" herein means the length in the direction parallel to the width direction (the direction perpendicular to the longitudinal direction) of the flexible printed circuit, and corresponds to $W_A$ in FIG. 9.

[Variation 2 of Embodiment 1]

Figure 11:
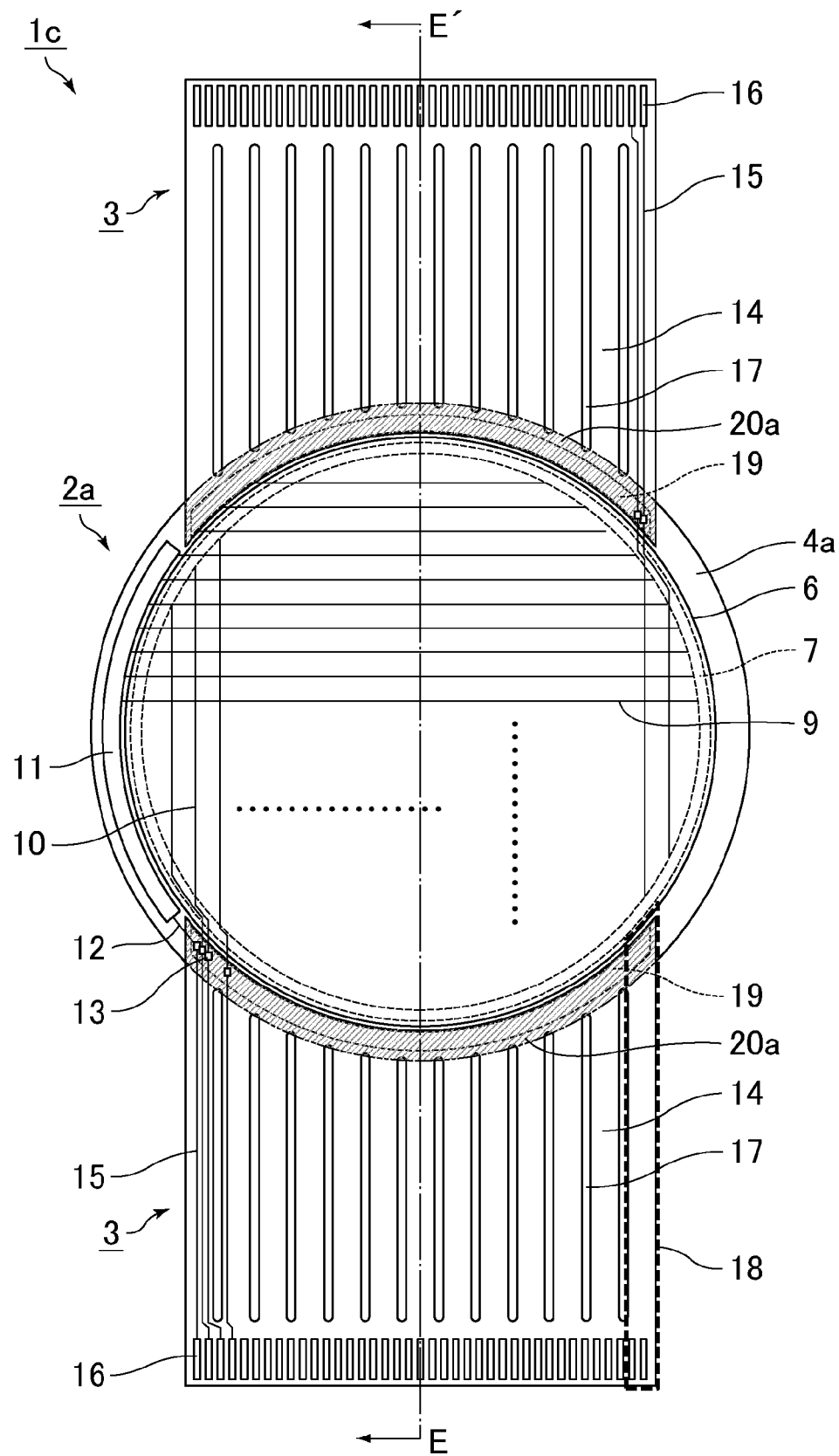
FIG. 11 is a schematic plan view of a liquid crystal display device of Variation 2 of Embodiment 1.
Figure 12:
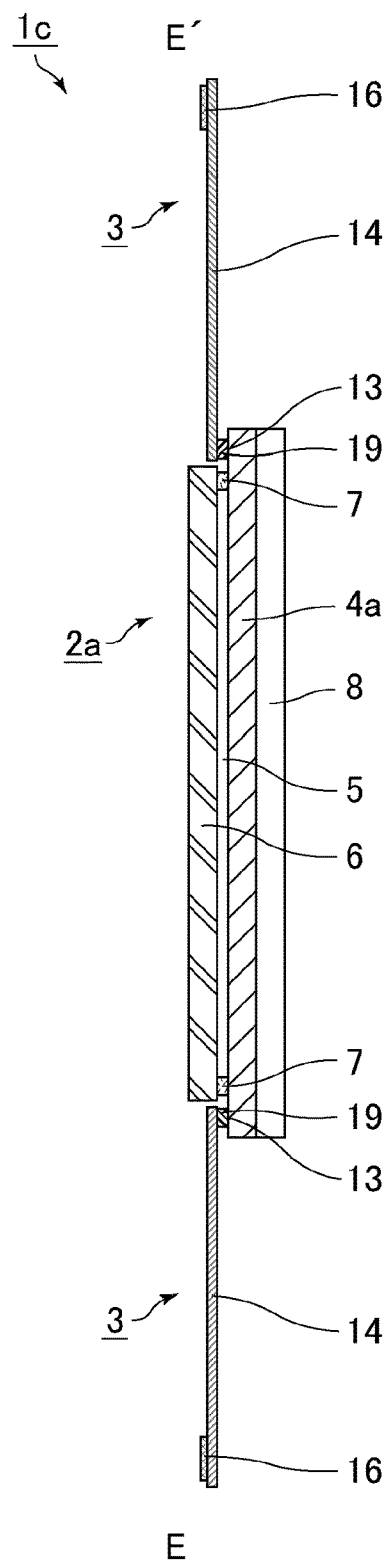
FIG. 12 is a schematic cross-sectional view of a cross section taken along the line E-E' in FIG. 11.

FIG. 11 is a schematic plan view of a liquid crystal display device of Variation 2 of Embodiment 1. FIG. 12 is a schematic cross-sectional view of a cross section taken along the line E-E' in FIG. 11. Variation 2 of Embodiment 1 is similar to Embodiment 1 except for the number of the flexible printed circuits attached to the liquid crystal display panel, and thus the description of the same points is omitted as appropriate.

In a liquid crystal display device 1c, two flexible printed circuits 3 are attached to the liquid crystal display panel 2a. Thus, the conductive lines such as the signal lines 10 can be routed separately to the two flexible printed circuits 3. This enables a reduction in the number of the conductive lines such as the signal lines 10 routed to one flexible printed circuit 3, resulting in a narrower frame, than in Embodiment 1. As the width of the flexible printed circuit 3 of such a liquid crystal display device 1c is increased as in the aforementioned Variation 1 of Embodiment 1, the frame can be more effectively narrowed. Further, since a larger number of the signal lines 10 are led to the flexible printed circuit 3, this structure is suitable for a high resolution liquid crystal display device including a larger number of pixels. Although the present variation provides a structure in which the two flexible printed circuits 3 are attached to the liquid crystal display panel 2a, multiple flexible printed circuits 3 may be attached to the liquid crystal display panel 2a.

Embodiment 2

Figure 13:
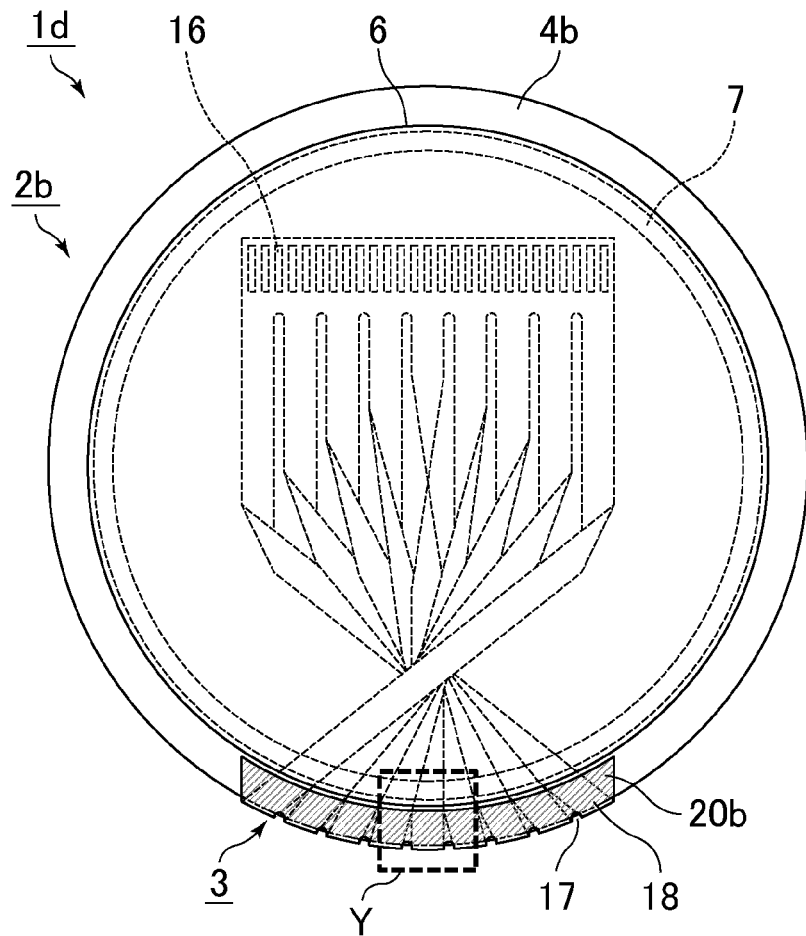
FIG. 13 is a schematic plan view of a liquid crystal display device of Embodiment 2, with a flexible printed circuit being bent toward the back surface side of the liquid crystal display device.
Figure 14:
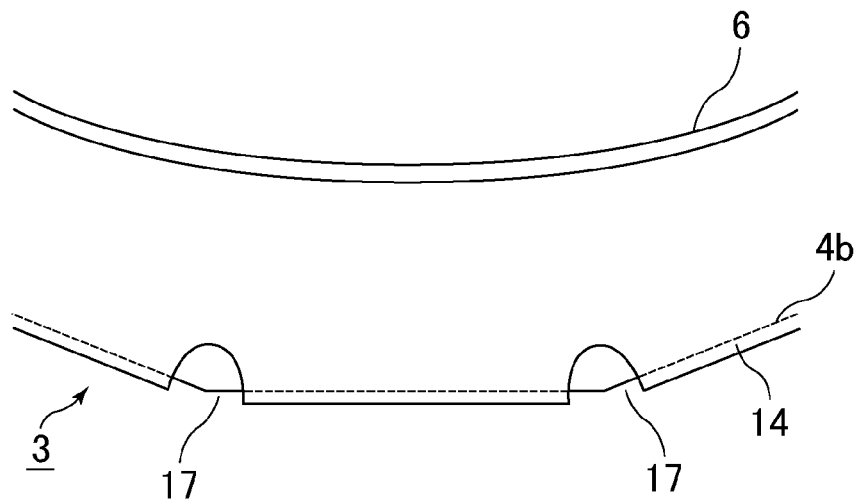
FIG. 14 is an enlarged schematic view of a portion Y in FIG. 13.

FIG. 13 is a schematic plan view of a liquid crystal display device of Embodiment 2, with a flexible printed circuit being bent toward the back surface side of the liquid crystal display device. FIG. 14 is an enlarged schematic view of a portion Y in FIG. 13. Embodiment 2 is similar to Embodiment 1 except for the shape of the periphery of the curved outer edge portion of the liquid crystal display panel attached to the flexible printed circuit, and thus the description of the same points are omitted as appropriate.

In a liquid crystal display device 1d, the periphery of a curved outer edge portion 20b (the periphery of a thin film transistor array substrate 4b in the present embodiment (the broken line in FIG. 14)) of a liquid crystal display panel 2b attached to the flexible printed circuit 3 is constituted by a polygonal line. Thereby, the peripheral portions of the curved outer edge portion 20b of the liquid crystal display panel 2b corresponding to the respective divided portions 18 are linear, and thus each of the divided portions 18 can be easily bent toward the back surface side of the liquid crystal display panel 2b along the corresponding peripheral portion of the curved outer edge portion 20b of the liquid crystal display panel 2b. In the liquid crystal display device 1d, only the periphery where the liquid crystal display panel 2b and the flexible printed circuit 3 are attached to each other is constituted by a polygonal line (an aggregate of short straight lines). Still, in a macroscopic view, the liquid crystal display device 1d can be regarded as having a curved shape. Further, as illustrated in FIG. 14, the slits 17 are preferably located at the respective corners of the polygonal line constituting the periphery of the curved outer edge portion 20b of the liquid crystal display panel 2b when the divided portions 18 are bent toward the back surface side of the liquid crystal display panel 2b. This enables easier bending of the divided portions 18.

In the liquid crystal display device 1d, the width of the flexible printed circuit 3 may be increased as in the aforementioned Variation 1 of Embodiment 1 and multiple flexible printed circuits 3 may be attached to the liquid crystal display panel 2b as in Variation 2 of Embodiment 1. These structures suitably enable a narrow frame.

ADDITIONAL REMARKS

The following describes examples of preferred embodiments of the flexible printed circuit of the present invention. These examples may be appropriately combined within the scope of the spirit of the present invention.

A second longitudinal end of the flexible substrate may at least partially have a curved shape. This enables suitable application of the present invention even when at least part of the second longitudinal end of the flexible substrate has a curved shape, and the flexible substrate can be suitably attached to the display panel.

The following describes examples of preferred embodiments of the display device of the present invention. These examples may be appropriately combined within the scope of the spirit of the present invention.

The second longitudinal end of the flexible substrate and the curved outer edge portion may be attached to each other with an anisotropic conductive film in between. This enables suitable electric coupling between the panel terminals disposed on the display panel and the conductive lines disposed on the flexible printed circuit via the anisotropic conductive film.

The flexible printed circuit may include multiple divided portions separated by the slits, and each of the divided portions may be bent along the periphery of the curved outer edge portion toward the back surface side of the display panel. This enables suitable bending of the flexible printed circuit toward the back surface side of the display panel while maintaining the outer shape of the display panel.

The periphery of the curved outer edge portion may have an arc shape. This enables suitable application of the present invention even when the periphery of the curved outer edge portion attached to the flexible printed circuit has an arc shape (a curved shape).

The display device may satisfy $a^2 < 8R + 8d_1 + 4$, wherein a represents the width (unit: mm) between the slits; R represents the radius of curvature (unit: mm) of the display panel; and $d_1$ represents the amount of protrusion (unit: mm) in the middle portion between the slits relative to the display panel in a plan view of the display device. This enables a sufficiently curved periphery of the display device at a portion where the flexible printed circuit is bent toward the back surface side of the display panel.

The periphery of the curved outer edge portion may be constituted by a polygonal line. This enables suitable application of the present invention even when the periphery of the curved outer edge portion attached to the flexible printed circuit is constituted by a polygonal line.

The slits may be located at the respective corners of the polygonal line constituting the periphery of the curved outer edge portion. This enables easier bending of the divided portions.

The flexible printed circuit may be twisted on the back surface side of the display panel, and the terminals may be located on the display panel side of the flexible substrate. This enables suitable folding of the flexible printed circuit on the back surface side of the display panel while suppressing the thickness of the display device.

The flexible printed circuit may have a width that is greater than ⅓ of a width of a display region of the display panel and is not greater than the width of the display region of the display panel. For the display panel which is a liquid crystal display panel, for example, this enables shorter distances of the conductive lines such as the signal lines routed to be coupled with the conductive lines of the flexible printed circuit, resulting in a narrower frame.

The at least one flexible printed circuit may include multiple flexible printed circuits each of which is the above flexible printed circuit, and the flexible printed circuits may be attached to the display panel. For the display panel which is a liquid crystal display panel, for example, this enables a reduction in the number of the conductive lines such as the signal lines routed to one flexible printed circuit, resulting in a narrower frame.

The display panel may be a liquid crystal display panel. This enables suitable application of the present invention even when the display panel is a liquid crystal display panel (i.e., the display device is a liquid crystal display device). The display panel may be of any type. Alternative to the liquid crystal display panel, the display device may be an organic electroluminescent display panel, an electrophoretic display panel, or a microelectromechanical system (MEMS) display panel, for example.

REFERENCE SIGNS LIST 1a, 1b, 1c, 1d: Liquid crystal display device
2a, 2b: Liquid crystal display panel
3: Flexible printed circuit
4a, 4b: Thin film transistor array substrate
5: Liquid crystal layer
6: Color filter substrate
7: Sealing material
8: Backlight
9: Scanning line
10: Signal line
11: Scanning line drive circuit
12: Conductive line led from scanning line drive circuit
13: Panel terminal (terminal of liquid crystal display panel)
14: Flexible substrate
15: Conductive line
16: Terminal (terminal of flexible printed circuit)
17: Slit
18: Divided portion
19: Anisotropic conductive film
20a, 20b: Curved outer edge portion

The invention claimed is:

1. A display device comprising:
   at least one flexible printed circuit including a flexible substrate provided with multiple slits, multiple conductive lines, and multiple terminals that are independently electrically coupled with the respective conductive lines; and a display panel including a curved outer edge portion having a curved whole shape at at least part of the outer edge thereof, the slits and the conductive lines being disposed in the longitudinal direction of the flexible substrate, the terminals being disposed on a first longitudinal end of the flexible substrate, the curved outer edge portion being provided with multiple panel terminals, a second longitudinal end of the flexible substrate and the curved outer edge portion being attached to each other, the flexible printed circuit including multiple divided portions separated by the slits, each of the divided portions being bent along the periphery of the curved outer edge portion toward the back surface side of the display panel, the flexible printed circuit being twisted on the back surface side of the display panel, and the terminals being located on the display panel side of the flexible substrate.

2. The display device according to claim 1, wherein the second longitudinal end of the flexible substrate at least partially has a curved shape.

3. The display device according to claim 1, wherein the second longitudinal end of the flexible substrate and the curved outer edge portion are attached to each other with an anisotropic conductive film in between.

4. The display device according to claim 1, wherein the periphery of the curved outer edge portion has an arc shape.

5. The display device according to claim 1, wherein the flexible printed circuit has a width that is greater than ⅓ of a width of a display region of the display panel and is not greater than the width of the display region of the display panel.

6. The display device according to claim 1, wherein the at least one flexible printed circuit comprises multiple flexible printed circuits each of which is the flexible printed circuit, and the flexible printed circuits are attached to the display panel.

7. The display device according to claim 1, wherein the display panel is a liquid crystal display panel.

8. The display device according to claim 4, which satisfies $a^2<8R+8d_1+4$, wherein a represents the width (unit: mm) between the slits; R represents the radius of curvature (unit: mm) of the display panel; and d1 represents the amount of protrusion (unit: mm) in the middle portion between the slits relative to the display panel in a plan view of the display device.

9. A display device comprising:

at least one flexible printed circuit including a flexible substrate provided with multiple slits, multiple conductive lines, and multiple terminals independently electrically coupled with the respective conductive lines; and a display panel including a curved outer edge portion having a curved whole shape at at least part of the outer edge thereof, the slits and the conductive lines being disposed in the longitudinal direction of the flexible substrate, the terminals being disposed on a first longitudinal end of the flexible substrate, the curved outer edge portion being provided with multiple panel terminals, a second longitudinal end of the flexible substrate and the curved outer edge portion being attached to each other, the flexible printed circuit including multiple divided portions separated by the slits, the divided portions being disposed in the longitudinal direction of the flexible substrate, each of the divided portions being bent along the periphery of the curved outer edge portion toward the back surface side of the display panel, the flexible printed circuit being twisted on the back surface side of the display panel, and the terminals being located on the display panel side of the flexible substrate.

10. The display device according to claim 9, wherein the second longitudinal end of the flexible substrate at least partially has a curved shape.

11. The display device according to claim 9, wherein the second longitudinal end of the flexible substrate and the curved outer edge portion are attached to each other with an anisotropic conductive film in between.

12. The display device according to claim 9, wherein the periphery of the curved outer edge portion has an arc shape.

13. The display device according to claim 9, wherein the flexible printed circuit has a width that is greater than ⅓ of a width of a display region of the display panel and is not greater than the width of the display region of the display panel.

14. The display device according to claim 9, wherein the at least one flexible printed circuit comprises multiple flexible printed circuits each of which is the flexible printed circuit, and the flexible printed circuits are attached to the display panel.

15. The display device according to claim 9, wherein the display panel is a liquid crystal display panel.

16. The display device according to claim 9, which satisfies $a^2<8R+8d_1+4$, wherein a represents the width (unit: mm) between the slits; R represents the radius of curvature (unit: mm) of the display panel; and $d_1$ represents the amount of protrusion (unit: mm) in the middle portion between the slits relative to the display panel in a plan view of the display device.

* * * * *